United States Patent [19]

Gregory et al.

[11] Patent Number: 5,304,938
[45] Date of Patent: Apr. 19, 1994

[54] METHOD AND APPARATUS FOR PROVIDING A LOWER FREQUENCY SIGNAL WITH REFERENCE TO A HIGHER FREQUENCY SIGNAL

[75] Inventors: Paul Gregory, Capitola; Oskar Leuthold; Nigel Bleasdale, both of Santa Cruz, all of Calif.

[73] Assignee: GEC Plessey Semiconductors, Inc., Scotts Valley, Calif.

[21] Appl. No.: 978,113

[22] Filed: Nov. 18, 1992

[51] Int. Cl.$^5$ .......................................... H03B 19/00
[52] U.S. Cl. ........................................ 328/15; 328/16; 331/57; 307/271; 377/47
[58] Field of Search ................... 331/45, 57, 60, 75; 307/271; 328/15, 16, 56, 25, 30; 377/39, 47, 48, 55, 56, 33, 106, 110, 114, 118

[56] References Cited

U.S. PATENT DOCUMENTS

| | | | |
|---|---|---|---|
| 3,678,398 | 7/1972 | Thomenius | 377/110 |
| 3,742,248 | 6/1973 | Eaton, Jr. | 307/471 X |
| 3,742,381 | 6/1973 | Hurd | 307/471 X |
| 3,789,304 | 1/1974 | May | 328/41 |
| 3,993,957 | 11/1976 | Davenport | 328/16 X |
| 3,995,222 | 11/1976 | Mitarai | 307/471 X |
| 4,017,801 | 4/1977 | Riedel | 307/471 X |
| 4,193,037 | 3/1980 | Kyu | 377/110 |
| 4,295,158 | 10/1981 | Nissen et al. | 377/48 X |
| 4,596,027 | 1/1986 | Bernardsonn | 377/33 |
| 4,658,406 | 4/1987 | Pappas | 377/48 |
| 4,686,489 | 8/1987 | Caspell | 331/57 |
| 4,775,805 | 10/1988 | Whitefoot | 307/471 X |
| 4,868,428 | 9/1989 | Cooper | 307/271 X |
| 4,891,609 | 1/1990 | Eilley | 331/57 |
| 4,942,595 | 7/1990 | Baca | 377/48 |
| 4,956,797 | 9/1990 | Berard | 377/47 X |
| 5,065,042 | 11/1991 | Thomsen et al. | 307/471 X |
| 5,065,415 | 11/1991 | Yamashita | 377/110 X |
| 5,081,428 | 1/1992 | Atriss et al. | 331/57 |
| 5,120,989 | 6/1992 | Johnson et al. | 307/271 X |
| 5,180,994 | 1/1993 | Martin et al. | 331/38 |

FOREIGN PATENT DOCUMENTS

| | | | |
|---|---|---|---|
| 57-18128 | 1/1982 | Japan | 377/47 |
| 189708 | 8/1986 | Japan | 328/15 |
| 34030 | 2/1990 | Japan | 377/47 |

OTHER PUBLICATIONS

IBM Technical Disclosure, "Digital Non-integer Divider", T. A. Chapman vol. 16, No. 6, Nov. 1973.
"Exclusive-Or Gate & Flip-Flops Make Half Integer Divider." by Tung-Sun Tung, Electronics, Jan. 19, 1978.
Computer Design, Jun. 1978, p. 130 "Exclusive-Or Frequency Multiplier" by Kenneth G. Harf (USA, vol. 17, No. 6).

Primary Examiner—Paul Gensler
Assistant Examiner—Arnold Kinkead
Attorney, Agent, or Firm—Phong K. Truong; Dennis S. Fernandez

[57] ABSTRACT

A method and apparatus for providing a lower frequency signal with reference to a higher frequency signal are disclosed. The apparatus of the invention comprises an oscillating signal generator, an integer logical divider, and a signal combiner. The signal generator receives an input voltage and, in response thereto, generates a first output oscillating signal and a second output oscillating signal, both having a first frequency. The two oscillating signals are separated by a ninety-degree phase shift. The integer logical divider receives the two oscillating signals and provides two output divided signals in response. The first divided signal is representative of the first oscillating signal except that its frequency is one-third the frequency of the first oscillating signal. Likewise, the second divided signal is representative of the second oscillating signal except that its frequency is one-third that of the second oscillating signal. The signal combiner receives these two divided signals and performs an XOR operation on them to produce an output signal having a second frequency which is equal to the first frequency divided by 1.5. Thus, the apparatus of the invention performs a logical divide-by 1.5 operation. By adjusting the phase difference between the two oscillating signals, and by properly modifying the other elements of the apparatus, other logical divide-by operations may be performed.

16 Claims, 6 Drawing Sheets

FIG. 4e   90 DEG

METHOD AND APPARATUS FOR PROVIDING A LOWER FREQUENCY SIGNAL WITH REFERENCE TO A HIGHER FREQUENCY SIGNAL

BACKGROUND OF THE INVENTION

1. Field of the Invention

This invention relates to electronic frequency dividers and more specifically to a frequency divider comprising a voltage-controlled ring oscillator having multiple phase-shifted outputs, an integer logical divider, and a signal combining circuit.

2. Description of the Background Art

As computers, especially personal computers, gain in functionality, they impose greater requirements on data storage devices such as hard disk drives. Because of the greater running speeds of today's computers, today's disk drives must likewise operate faster. To facilitate fast data access, many hard disk drives implement a 1/7 encoding format. The use of this format requires that two clock signals be generated: a first clock signal (hereinafter, "data rate signal") which has the same frequency as the desired data rate, and a second clock signal (hereinafter, "higher frequency signal") which, because of coding requirements, has a frequency 1.5 times that of the data rate.

These clock signals could be generated separately by individual clock generators, but it would be very difficult if not impossible to synchronize the two separate signals. For this reason, the two required clock signals are usually generated using a single clock source. The higher frequency signal is typically generated by a voltage-controlled oscillator (VCO), and the data rate signal is derived from the higher frequency signal by performing a "logical divide by 1.5" operation on the higher frequency signal to obtain a signal having a frequency equal to the higher frequency divided by 1.5. The difficult aspect of this process is the implementation of the logical 1.5 divider.

The prior art has used several methods to implement the logical 1.5 divider. One method requires that a first signal be generated by a VCO having a frequency equal to 1.5 times the desired data rate. Then, every third clock pulse is deleted from this first signal to provide an output signal having an effective frequency equal to the frequency of the first signal divided by 1.5. Hence, the data rate signal is derived. While this method does generate a data rate signal having the correct number of clock pulses, the resulting signal is non-symmetrical. That is, while the number of clock pulses is correct, the duration of each clock pulse is the same as if the pulse had been from the higher frequency signal. This in effect forces the controller integrated circuit (which is driven by this clock signal) to respond with the same speed as if it were being driven by the higher frequency signal. Thus, even though the nominal frequency of the signal is correct, the controller effectively operates as if it were being driven by the higher frequency signal.

Another prior art method requires that a VCO generate a first signal having a frequency three times that of the desired data rate. The data rate signal is derived from the first signal by using a logical divide-by-three circuit, and the higher frequency signal is derived from the first signal by employing a divide-by-two circuit. The result is that the higher frequency signal has a frequency which is 1.5 times that of the data rate signal. A problem with this method is that it requires the VCO to generate a signal having a frequency three times that of the data rate. The frequencies that a VCO can generate are limited. Currently, it is difficult for any VCO to generate signals having frequencies much higher than 60 MHz. This would means that the data rate signal may only have a frequency of approximately 20 MHz. This imposes a significant and undesirable limitation on the rate of data transfer.

Therefore, there exists a need for a logical 1.5 divider which provides a symmetrical output signal without needing to generate a signal having a frequency three times that of the data transfer rate.

SUMMARY OF THE INVENTION

The present invention provides a method and apparatus for an improved logical divider (also called a frequency divider) which is capable of performing a non-integer frequency division without having to generate a signal having a frequency much higher than the desired frequency. The apparatus of the invention comprises an oscillating signal generator, an integer logical divider, and a signal combiner. The signal generator receives a voltage signal at its input and, in response, generates two output oscillating signals both having a first frequency. The two output oscillating signals are separated by a predetermined phase shift. The integer logical divider receives the two oscillating signals and provides two output divided signals. The first divided signal is representative of the first oscillating signal except that the frequency of the divided signal is equal to the frequency of the first oscillating signal divided by a specified integer. Likewise, the second divided signal is representative of the second oscillating signal except that its frequency is equal to the frequency of the second oscillating signal divided by the same specified integer. The signal combiner receives the two divided signals from the integer logical divider and combines them to produce a combined output signal having a frequency equal to the first frequency divided by a predetermined factor.

To specifically achieve a logical 1.5 divider, the two output oscillating signals are separated by a ninety-degree phase shift. The integer logical divider is preferably a logical divide-by-three divider, and the signal combiner takes the form of an XOR logic gate. Other logical dividers may be achieved by varying the phase separation between the two output oscillating signals, changing the integer divider, and by modifying the circuitry of the signal combiner.

The method and apparatus of the present invention has several advantages over the prior art. First of all, the combined output signal from the signal combiner is a symmetrical signal. That is, it is a true oscillating signal having the proper frequency, not some higher frequency signal with some pulses deleted. In addition, the frequency divider of the invention only generates those signals which are needed: the initial higher frequency signal and the output lower frequency signal. It is not necessary to generate a signal having three time the data rate. Thus, the data transfer rate is not unnecessarily limited by the frequency limits of the oscillating signal generator. Furthermore, the apparatus of the invention may be modified in accordance with the principles taught in the present disclosure to implement other logical dividers. Thus, the invention is quite versatile. Overall, a vastly improved method and apparatus for a frequency divider are disclosed.

DETAILED DESCRIPTION OF THE PREFERRED EMBODIMENT

Figure 1:
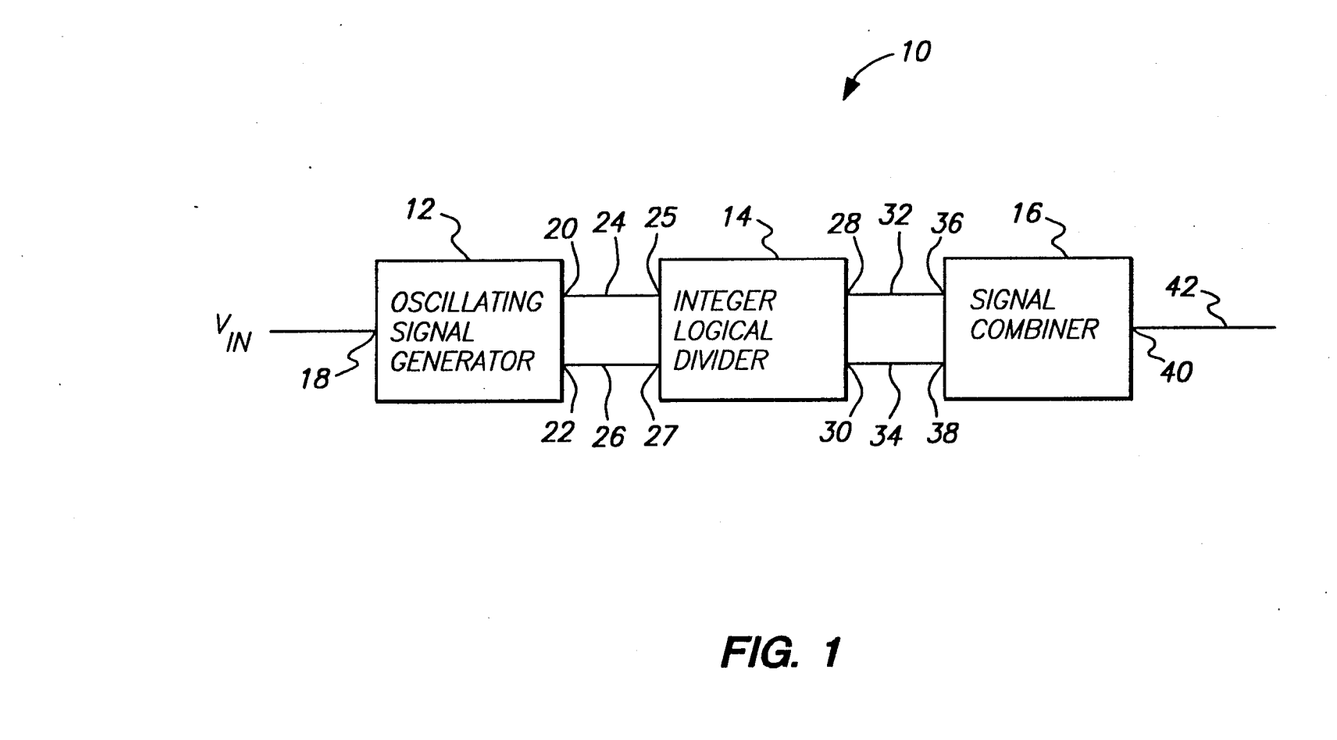
FIG. 1 is a block diagram representation of the preferred embodiment of the apparatus of the invention.

A block diagram representation of the apparatus of the present invention is presented in FIG. 1, wherein the apparatus 10 comprises an oscillating signal generator 12, an integer logical divider 14, and a signal combiner 16. The signal generator 12 has an input 18 for receiving an input voltage Vin, and two outputs 20, 22. In response to the input voltage Vin, the signal generator 12 generates two oscillating output signals: a first oscillating output signal 24 on output 20 having a first frequency, and a second oscillating output signal 26 on output 22 having the same first frequency. The output signals 24 and 26 are separated from each other by a predetermined phase shift.

The integer logical divider 14 has two inputs 25, 27 and two outputs 28, 30. The integer logical divider 14 receives the first oscillating signal 24 at input 25, and the second oscillating signal 26 at input 27. In response to the input signals 24, 26, divider 14 generates a first output divided signal 32 on output 28, and a second output divided signal 34 on output 30. The first output divided signal 32 is a signal representative of the first oscillating signal 24 but having a frequency equal to the frequency of the first oscillating signal divided by a specified integer. Likewise, the second output divided signal 34 is a signal representative of the second oscillating signal 26 but which has a frequency equal to the frequency of the second oscillating signal 26 divided by the same specified integer. Like the first and second oscillating signals 24, 26, the output divided signals 32, 34 are also separated by the predetermined phase difference.

The signal combiner 16 has two inputs 36 and 38 for receiving the output divided signals 32 and 34, respectively, and an output 40. Signal combiner 16 receives the two divided signals 32, 34 and combines them to produce a combined output signal 42 on output 40. Depending on the phase shift separation between the two oscillating output signals 24, 26 and the integer by which the frequency of these signals 24, 26 has been divided, the actual frequency of the combined output signal 42 will vary. However, in all cases, the combined output signal 42 will have a frequency equal to the frequency of the oscillating output signals 24, 26 divided by a predetermined factor. This predetermined factor may but need not be an integer. Certain logical dividers which divide by an integer, such as logical divide-by-two and logical divide-by-three dividers, are generally known in the art. The present invention is directed at providing a more general logical divider. The logical divider of the present invention is capable of performing a logical division operation involving any rational number which includes, but is not limited to, any integer. The elements of the apparatus 10 will now be described in more detail. For the sake of simplicity, the signal generator 12, the integer logical divider 14, and the signal combiner 16 will only be described in detail with respect to a 1.5 logical divider, but it should be noted that other dividers may be implemented using the method and apparatus taught in this disclosure.

Figure 2:
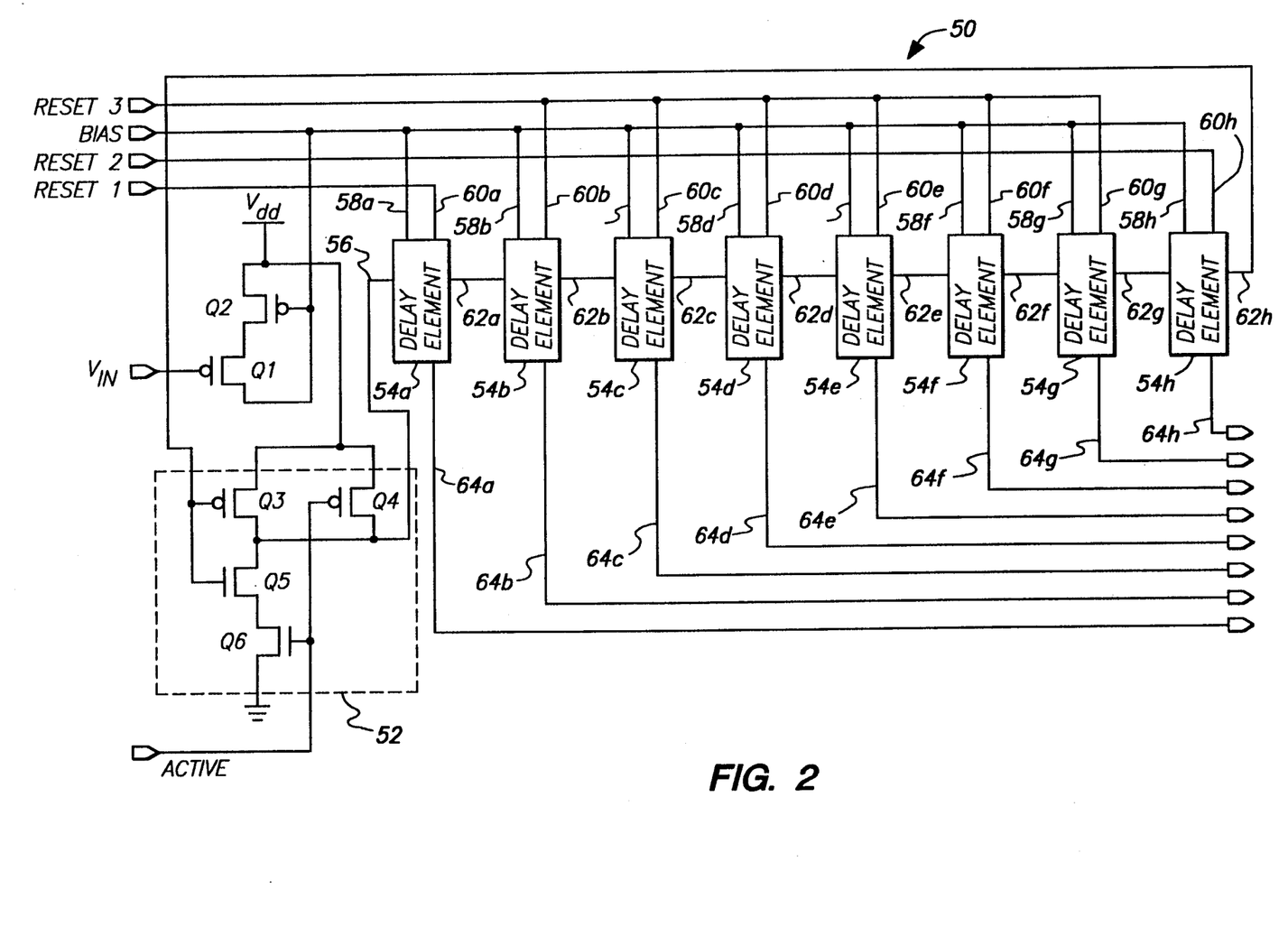
FIG. 2 is a functional block diagram of the voltage controlled ring oscillator of the preferred embodiment of the invention.

With reference to FIG. 2, the oscillating signal generator 12 of the invention preferably takes the form of a voltage-controlled ring oscillator 50, comprising two P-channel MOSFETs Q1, Q2, a NAND structure 52, and a plurality of non-inverting delay elements 54a-54h. The NAND structure 52 preferably comprises two P-channel MOSTFETs Q3, Q4 and two N-channel MOSFETs Q5, Q6. While this typical NAND structure is preferred, others may be used to perform the necessary NAND function. The NAND structure 52 receives two inputs: a signal from the ACTIVE line applied to the gates of transistors Q4 and Q6, and the delay output signal 62h from delay element 54h applied to the gates of transistors Q3 and Q5. NAND structure 52 performs a NAND function on these two input signals and provides an output signal 56 to the signal input of delay element 54a.

Each of the delay elements 54a-54h receives three input signals: an input signal which is either the delay output signal 62a-62g from one of the preceding delay elements 54a-54g or the output from the NAND structure 56; a bias signal 58a-58h from the BIAS line; and a reset signal 60a-60h from one of the RESET lines. Delay element 54a receives the reset signal from RESET 1, delay element 54h receives the reset signal from RESET 2, and the remaining delay elements 54b-54g receive the reset signal from RESET 3. In response to these three inputs, each delay element 54a-54h provides a delay output signal 62a-62h and a digital output signal 64a-64h, these signals being complements of each other. That is, digital output 64a is the inverted version of delay output 62a, digital output 64b is the inverted version of delay output 62b, and so forth. Since the delay elements 54a-54h are non-inverting elements, the delay output signal 62a-62h of each delay element 54a-54h is at the same logic level as the input signal to that particular delay element. The only difference between the delay output signal 62a-62h and the input signal of each delay element 54a-54h is that a time delay or phase shift has been introduced into the delay output signal 62a-62h.

The delay elements 54a-54h are connected to each other in ring fashion. The delay output signal 62a-62g from each of the first seven delay elements 54a-54g is sent to the signal input of the next delay element, and the delay output signal 62h of the last delay element 54h is sent back to the NAND structure 52. The NAND structure 52, in turn, NAND's this delay output signal 62h with the signal on the ACTIVE line and provides an input to the first delay element 54a. Hence, the delay elements 54a-54h and the NAND structure 52 form a complete circular loop or ring. In this manner, the delay output signals 62a-62h are recycled within the ring oscillator 50 to generate oscillating signals.

Figure 3:
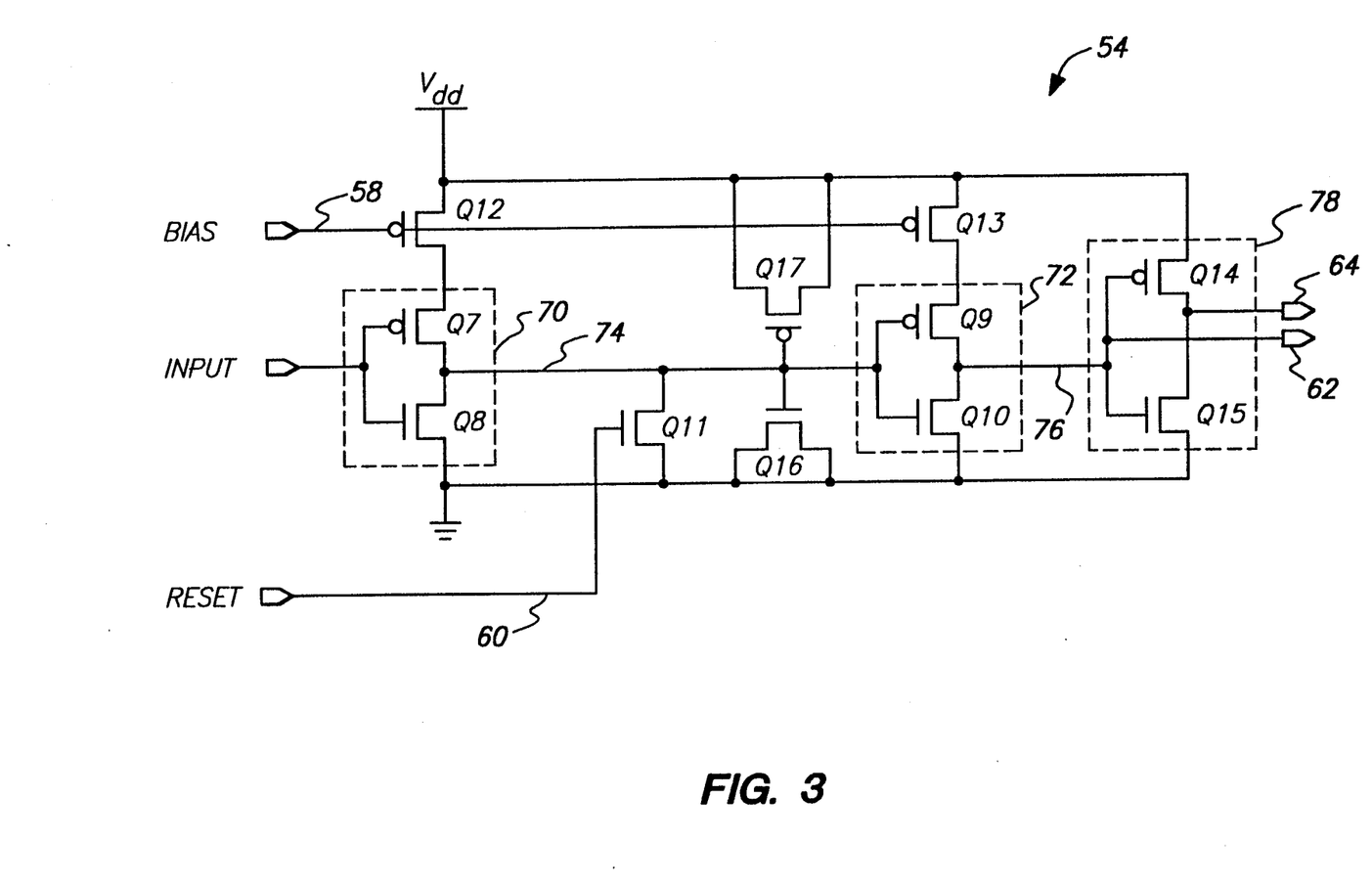
FIG. 3 is detailed schematic of the delay element of the voltage controlled ring oscillator of the preferred embodiment of the invention.
Figure 4A:
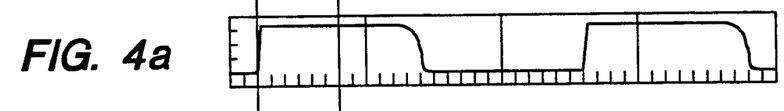
FIGS. 4a-4h are timing diagrams of the digital output signals 64a-64h, respectively, from the delay elements of the ring oscillator of the preferred embodiment.
Figure 4B:
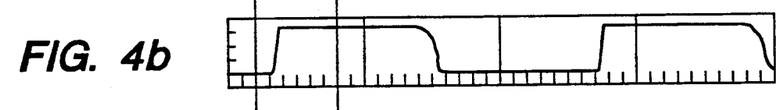
Figure 4C:
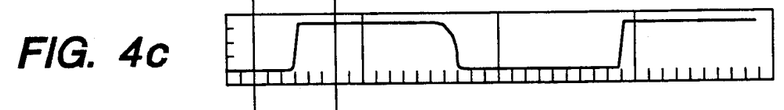
Figure 4D:
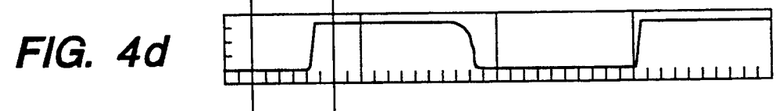
Figure 4E:
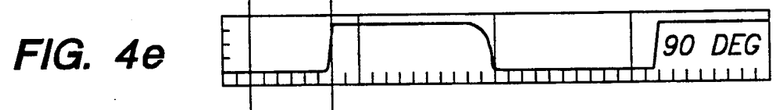
Figure 4F:
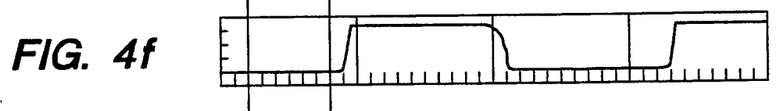
Figure 4G:
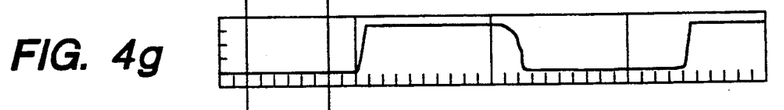
Figure 4H:
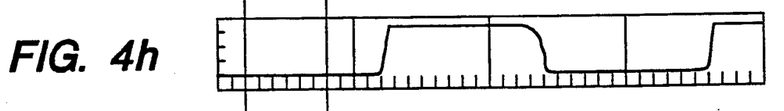

A detailed schematic of the preferred embodiment of the delay elements in FIG. 2 is provided in FIG. 3. Since the delay element 54 in FIG. 3 could be any one of the delay elements 54a-54h in FIG. 2, the element in FIG. 3 will be referred to simply as element 54.

The delay element 54 comprises three inverting stages 70, 72, 78. The first inverting stage 70 comprises a P-channel MOSFET Q7 and an N-channel MOSFET Q8. The gates of both transistors Q7, Q8 are tied together and both receive the input signal from the INPUT line. Transistor Q7 has its drain terminal connected to the drain terminal of transistor Q8 and its source terminal tied to the drain terminal of bias transistor Q12, and transistor Q8 has its source terminal connected to ground. The output 74 of the first inverting stage 70 is taken from the drain terminals of the transistors Q7, Q8 and is connected to the input of the second inverting stage 72.

The second inverting stage 72, like the first, comprises a P-channel MOSFET Q9 and an N-channel MOSFET Q10. The gates of transistor Q9 and Q10 are tied together to receive the output 74 from the first inverting stage 70 and the drains of these transistors Q9, Q10 are also connected. The source of transistor Q9 is tied to the drain terminal of bias transistor Q13 while the source terminal of transistor Q10 is grounded. The output 76 of the second inverting stage 72 is taken from the drains of the transistors Q9 and Q10 and this output 76 serves as the delay output signal 62 of the delay element 54.

The third inverting stage 78 comprises a P-channel transistor Q14 and an N-channel transistor Q15. The source of transistor Q14 is tied to a voltage source Vdd and the source of transistor Q15 is grounded. The gate terminals of these transistors Q14, Q15 are tied together as are the drain terminals. The output 76 from the second inverting stage 72 is received by the third inverting stage 78 at the gate terminals of the transistors Q14, Q15. The output of the third inverting stage 78 is taken from the drains of the transistors Q14, Q15 and this output represents the digital output signal 64 of the delay element 54.

The delay element 54 also comprises a reset transistor Q11 which is an N-channel MOSFET having its drain connected to the output 74 of the first inverting stage 70, its source connected to ground, and its gate connected to the RESET line to receive a reset signal. This reset transistor 11 allows an external reset signal 60 to reset the delay element 54 so that the oscillator start-up sequence may be controlled. This reset feature in essence allows the delay element 54 to be synchronized with either the other elements in the oscillator 50 or with some components external to the oscillator 50 or both.

Delay element 54 further comprises a pair of bias transistors Q12, Q13 which receive at their gate terminals a bias signal 58 from the BIAS line. Transistor Q12 is a P-channel MOSFET having its source terminal tied to a voltage source Vdd and its drain terminal connected to the source of transistor Q7, while transistor Q13 is also a P-channel MOSFET having its source terminal connected to a voltage source Vdd and its drain terminal tied to the source terminal of transistor Q9. The bias transistors Q12, 13, because they are situated between the voltage source Vdd and the inverting stages 70, 72, control the amount of current flowing through the inverting stages 70, 72. By using the bias voltage 58 to alter the conductivity of the bias transistors Q12, Q13, the current flow through the inverting stages 70, 72 may be altered. Changing the current flow through the inverting stages causes the rise time of each inverting stage to be altered. This, in turn, causes the delay through the inverting stage to be changed which, in effect, causes the oscillating frequency of the oscillator 50 to be altered. Thus, the bias voltage may be used to control the oscillating frequency of the oscillator 50.

The delay element 54 further comprises an N-channel MOSFET Q16 and a P-channel MOSFET Q17. The gate of transistor Q16 receives the output 74 from the first inverting stage 70. The source and drain terminals of transistor Q16 are both connected to ground. The gate of transistor Q17 also receives output 74 but the drain and source terminals of transistor Q17 are connected to the voltage source Vdd.

With reference to FIGS. 2 and 3, the operation of the oscillator 50 will now be described. In operation, the oscillator 50 receives an input voltage Vin at the gate terminal of transistor Q1. The transistor pair Q1 and Q2 behave as an on/off switch. When the voltage Vin is at a logic "high" voltage level, transistor Q1 is rendered non-conductive; thus, a high voltage is present on the BIAS line. A high voltage on the BIAS line renders the bias transistors Q12, Q13 non-conductive so that no current flows through the inverting stages 70, 72. Hence, each of the delay elements 54a-54h is rendered inactive. In normal operation, however, the input voltage Vin is at a logic "low" voltage level which causes the transistor Q1 to conduct. This, in turn, causes the voltage on the BIAS line to be low, thus, rendering bias transistors Q12, Q13 conductive. This in effect activates each of the delay elements 54 and turns on the oscillator 50.

The transistor pair Q1, Q2 also behaves as a frequency controller. The conductivity of transistor Q1 affects the bias voltage on the BIAS line. As discussed previously, the delay of each delay element, and hence, the frequency of the oscillator, may be controlled by controlling the bias voltage on the BIAS line. Thus, the conductivity of transistor Q1 controls the frequency of the signals outputted by the oscillator 50. Since the input voltage Vin controls the conductivity of transistor Q1, the frequency of the oscillator is also controlled by the input voltage. Hence, ring oscillator 50 is a voltage-controlled oscillator (VCO).

Upon activation by a proper input voltage Vin, all of the delay elements 54a-54h are reset by sending logic "high" signals on reset lines RESET 1, 2, 3. With reference to FIG. 3, the reset signal 60 is received at the base of the reset transistor Q11. A logic "high" signal renders the transistor Q11 conductive so as to ground effectively the output 74 from the first inverting stage 70. This signal 74 is inverted by the second inverting stage 72 so that a logic "high" signal appears at the delay output 62 of the element 54. Hence, resetting the oscillator 50 causes each of the delay elements 54a-54h to output a logic "high" signal on its delay output 62a-62h.

The delay output signal 62h from the last delay element 54h is sent to one of the inputs of the NAND structure 52. This signal 62h is NANDed with the signal on the ACTIVE line to produce the output signal 56 from the NAND structure which is sent to the signal input of the first delay element 54a. The signal of the ACTIVE line (sent by an external source not shown in FIG. 2) is at a logic "high" during operation of the oscillator. Thus, the initial output of the NAND structure, and hence the input to delay element 54a, is a logic "low" signal.

With reference to FIG. 3, this signal is received by the first inverting stage 70 of the delay element 54. As the input signal propagates through the first inverting stage 70, the inverting stage 70 not only inverts the input signal but also introduces a time delay or phase shift so that the output signal 74 from the first inverting stage 70 is an inverted, phase-shifted version of the input signal. The amount of the phase shift is determined by the level of the voltage on the BIAS line. Output signal 74 is sent to the second inverting stage 72 where the signal is once again inverted and a second time delay is introduced. The output signal 76 from the second inverting stage 72 represents the delay output 62 of the delay element 54. It is preferable for the element 54 to have two inverting stages because this ensures that the delay is symmetrical with respect to both the positive and negative transitions. Because the delay output 62 is a twice-inverted version of the input signal, it is at the same logic level as the input signal. Thus, element 54 is a non-inverting element. The digital output signal 64 is derived by sending the output signal 76 through the third inverting stage 78, thereby providing an inverted version of the output delay signal 62. The digital output signal 64 is sent to external circuitry to be used as a clock signal while the delay output signal 62 is sent to the signal input of the next delay element.

Referring once again to FIG. 2, the delay output signal 62a from the first delay element 54a is sent to the signal input of the second delay element 54b. The second delay element 54b, like the first delay element 54a, inverts the input signal 62a twice and introduces an additional time delay so as to provide a delay output signal 62b which is a phase-shifted, non-inverted version of the input signal 62a. This delay output signal 62b is, in turn, sent to the signal input of the third delay element 54c where the same process is performed. Each of the remaining delay elements 54d-54h performs this process on a respective input signal 62c-62g.

Thus far, the non-inverting delay elements 54a-54h have only introduced time delays into the input signals. They have not changed the logic level of the original input signal 56. To have an oscillator, however, it is necessary to invert the signal periodically so that both "low" and "high" signals are provided. The NAND structure 52 performs this inverting function. To illustrate, note that the original input signal 56 was at a logic "low" when it was inputted to delay element 54a. Since the delay elements 54a-54h are non-inverting, the delay output 62h from delay element 54h should also be at a logic "low". This "low" signal 62h is sent to the NAND structure 52 where it is NANDed with a logic "high" signal on the ACTIVE line. This operation produces a logic "high" output. Thus, a logic "high" signal will now propagate through the delay elements 54a-54h. After delay element 54h processes the "high" signal, the NAND structure 52 will once again NAND the signal 62h with a "high" signal on the ACTIVE line, thereby, producing a logic "low" signal on its output 56 which is sent to the signal input of delay element 54a. Thus, the signal level is changed each time it is processed by the NAND structure 52. Oscillating signals are thus produced. It should be noted that the NAND structure 52 introduces some asymmetry to the system and this asymmetry produces some degree of error in the phasing of the outputs of the oscillator 50. To minimize the error, the propagation delay time of the NAND structure should be quite small relative to the delay time of each of the delay elements 54a-54h.

Since each delay element 54a-54h introduces its own time delay or phase shift to an input signal, the delay outputs 62a-62h are all phase-shifted from one another. That is, signal 62b is phase-shifted from signal 62a, and signal 62c is phase-shifted from signal 62b, and so on. Thus, sixteen signals (eight delay output signals 62a-62h and eight digital output 64a-64h signals) having different phases may be derived from the oscillator 50. It should be noted, however, that while these sixteen signals may differ in phase, they all have the same frequency. FIGS. 4a-4h represent the timing diagrams for the eight digital output signals 64a-64h, respectively. The timing diagrams for the eight delay output signals 62a-62h may be derived from these diagrams simply by inverting the signals in each of the timing diagrams FIGS. 4a-4h.

FIGS. 4a-4h illustrate the phase shifts between the different digital signals 64a-64h. Note that digital output signal 64e (FIG. 4e) lags digital output signal 64a (FIG. 4a) by a quarter of a cycle. At time T1, signal 64a is making its low to high transition. In contrast, signal 64e does not make its low to high transition until time T2. By time T2, the signal 64a has already gone through one quarter of its cycle. Thus, signal 64e lags signal 64a by a quarter of a cycle or by ninety degrees. Likewise, signals 64b and 64f, signals 64c and 64g, and signals 64d and 64h are separated by the same phase difference.

To implement a 1.5 logical divider, the ring oscillator 50 preferably provides two oscillating signals which are separated by a ninety degree phase difference. Since all four of the above signal pairs 64a and 64e, 64b and 64f, 64c and 64g, 64d and 64h are separated by a ninety degree phase shift, any of these signal pairs may be sent to the integer logical divider 14 (FIG. 1). For the sake of convenience, it will be assumed that signals 64a and 64e are sent to the integer logical divider 14 as the first and second oscillating signals 24, 26, respectively.

Figure 5:
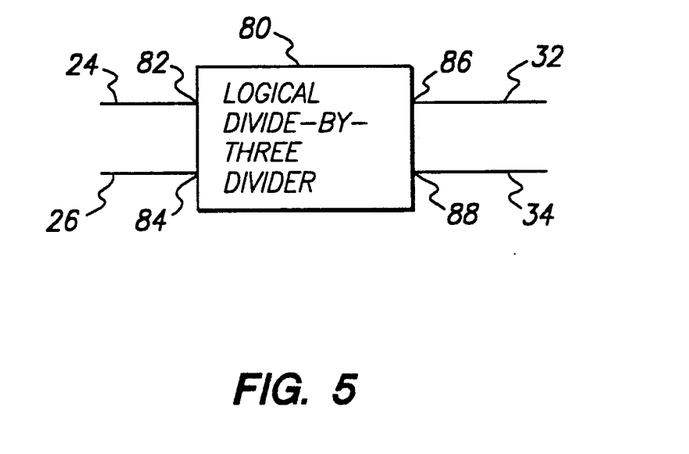
FIG. 5 is a functional block diagram of the integer logical divider, in the form of a logical divide-by-three divider, of the preferred embodiment.

To implement a logical 1.5 divider, the integer logical divider 14 preferably takes the form of a logical divide-by-three divider as shown in FIG. 5. Since logical divide-by-three dividers are well known in the art, only the function and not the structure will be described herein.

The divider 80 receives at its first input 82 the first oscillating signal 24, and at its second input 84 the second oscillating signal 26. In response, the divider generates a first output divided signal 32 on the first output 86, and a second output divided signal 34 on the second output 88. As its name may suggest, divider 80 divides the frequency of the first oscillating signal 24 by a factor of three and generates a first output divided signal 32 which is representative of the first oscillating signal 24. In other words, the first divided signal 32 is equal to the first oscillating signal 24 in all respects (phase, amplitude, etc.) except that the frequency of the first divided signal 32 is one-third the frequency of the first oscillating signal 24. In essence, the first divided signal 32 is just a slower version (by a factor of three) of the first oscillating signal 24. Likewise, the second output divided signal 34 is representative of the second oscillating signal 26 in all respects except that its frequency is one-third that of the second oscillating signal 26. Since the input oscillating signals 24, 26 were separated by a ninety-degree phase difference, the divided signals 32, 34, because they are representative of the input signals 24, 26, are also separated by a ninety-degree phase difference.

Figure 6:
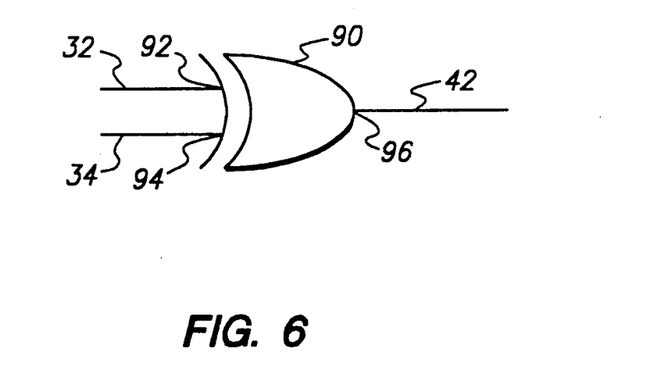
FIG. 6 is a circuit diagram of the signal combiner of the preferred embodiment.

The signal combiner for a logical 1.5 divider preferably takes the form of an exclusive-OR (XOR) logic gate 90 as shown in FIG. 6. The XOR gate 90 has two inputs 92, 94 for receiving the first and second output divided signals 32, 34 from the logical divide-by-three divider 80, and one output 96. When the input signals 32, 34 are at the same logic level, the output signal 42 from the XOR gate 90 is at a logic "low". On the other hand, when the input signals 32, 34 are at different logic levels, the output 42 of the XOR gate 90 is at a logic "high". Thus, XOR gate 90 performs an exclusive-or or an anti-equivalence logical function.

Figure 7A:
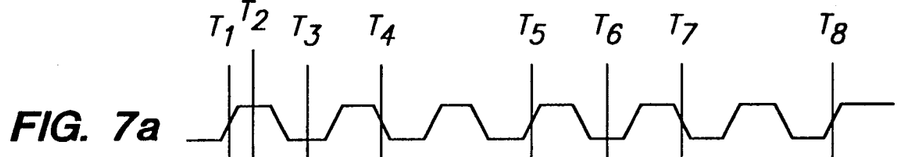
FIGS. 7A-7E are timing diagrams of the two output oscillating signals from the signal generator, the two divided signals from the integer logical divider, and the combined output signal from the signal combiner, respectively.
Figure 7B:
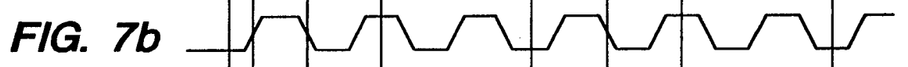

To illustrate the operation of the logical 1.5 divider of the invention, reference is made to the timing diagrams illustrated in FIGS. 7A–7F. FIG. 7A is a timing diagram for the first oscillating signal 24, and FIG. 7b is a timing diagram for the second oscillating signal 26. From these two diagrams, the phase difference between the two oscillating signals 24, 26 may be perceived. With reference to FIG. 7A, it can be seen that at time T1, the first oscillating signal is in the middle of a low to high transition. In contrast, the second oscillating signal (FIG. 7b) is not in the middle of a low to high transition until time T2. By time T2, the first oscillating signal has already gone through one quarter of its cycle. Thus, the second oscillating signal lags the first oscillating signal by a quarter of a cycle or by ninety degrees. Both oscillating signals 24, 26 are sent to the inputs of the logical divide-by-three divider as shown in FIG. 5.

Figure 7C:
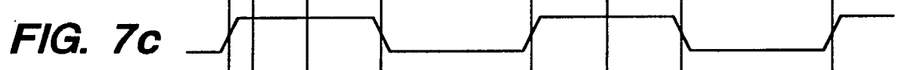

FIGS. 7C is a timing diagram of the first output divided signal 32 from the logical divide-by-three divider. As can be seen from FIG. 7C, this signal goes through a complete cycle between times T1 and T5. In the same time period, the first oscillating signal (FIG. 7A) goes through three cycles. Thus, the frequency of the first output divided signal is clearly one-third that of the first oscillating signal.

Figure 7D:
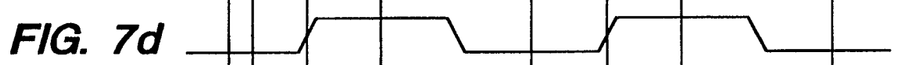

Similarly, FIG. 7D is a timing diagram of the second output divided signal 34 from the logical divide-by-three divider. Between times T3 and T6, this signal goes through a complete cycle. During the same time period, the second oscillating signal (FIG. 7B) goes through three cycles. Thus, the second output divided signal is just the second oscillating signal with its frequency divided by a factor of three.

It should be noted at this point that the two output divided signals 32, 34 are separated by a ninety-degree phase shift. This can be seen with reference to FIGS. 7C and 7D. FIG. 7C shows that the first output divided signal is in the middle of a low to high transition at time T1. The second output divided signal (FIG. 7D), however, does not make this transition until time T3. By time T3, the first divided signal has already gone through one quarter of its cycle. Hence, like the two oscillating signals 24, 26, the first and second divided signals 32, 34 are also separated by a ninety-degree phase shift. This is as it should be since the divided signals 32, 34 are representative of the oscillating signals 24, 26.

Figure 7E:
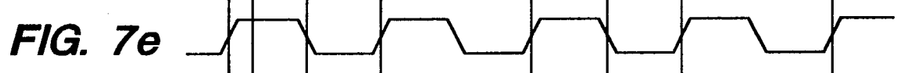

The XOR gate 90 (FIG. 6) receives as inputs the first and second divided signals 32, 34 and performs an exclusive-OR operation on them. FIG. 7E is a timing diagram of the combined output signal 42 from the XOR gate 90 showing the result of the XOR operation on the two divided signals 32, 34. With reference to FIGS. 7C–7E, between times T1 and T3, the first divided signal (FIG. 7C) is at a logic "high" while the second divided signal (FIG. 7D) is at a logic "low". Since the XOR gate performs an anti-equivalence operation, the combined output signal 42 from the XOR gate is at a logic "high" during this time as shown in FIG. 7E. Between times T3 and T4, however, both divided signals (FIGS. 7C and 7D) are at a logic "high"; thus, the combined output signal 42 (FIG. 7E) from the XOR gate 90 is at a logic "low" during this time period. Performing this operation for all time periods yields the combined output signal 42 depicted in FIG. 7E.

Note that the combined output signal shown in FIG. 7E has the desired frequency. Between times T1 and T4, the combined output signal in FIG. 7E goes through a complete cycle. During the same time period, the first oscillating signal (FIG. 7A) goes through 1.5 cycles. Thus, the first oscillating signal has a frequency which is 1.5 times that of the combined output signal. To put it another way, the combined output signal has a frequency equal to the frequency of the first oscillating signal divided by 1.5. Thus, a 1.5 logical divider is achieved.

Thus far, only a 1.5 logical divider has been described. However, other logical dividers may be implemented by adjusting the phase difference between two or more oscillating signals, and by modifying the other components 14, 16.

What is claimed is:

1. An apparatus for providing a lower frequency signal with reference to a higher frequency signal, said apparatus comprising:

a signal generator for providing a first oscillating signal having a first frequency, and a second oscillating signal having said first frequency said second oscillating signal being out of phase with said first oscillating signal by substantially ninety degrees;

a divider for receiving said first and second oscillating signals, said divider providing a first output divided signal representative of said first oscillating signal having a frequency equal to said first frequency divided by a selected integer, and a second output divided signal representative of said second oscillating signal having a frequency equal to said first frequency divided by said selected integer, said second divided signal being out of phase with said first divided signal by substantially ninety degrees; and a signal combiner for receiving said first and second divided signals, and performing an exclusive-OR operation on said first and second divided signals to produce a combined output signal having a frequency equal to said first frequency divided by a selected factor.

2. The apparatus of claim 1, wherein said selected integer is three, and wherein said selected factor is 1.5.

3. The apparatus of claim 2, wherein said divider is a logical divide-by-three divider.

4. The apparatus of claim 1, wherein said signal combiner comprises an XOR gate having two inputs for receiving said first and second divided signals, and one output for providing said combined output signal.

5. The apparatus of claim 1, wherein said signal generator comprises a ring oscillator, comprising:

a first delay element having an input and an output for receiving a first input signal and for generating a delay output signal which is a time-delayed version of said input signal;

a plurality of subsequent delay elements each having an input and an output for receiving a delay output signal from a preceding delay element and for generating a delay output signal which is a time-delayed version of the delay output signal from said preceding delay element;

a final delay element having an input and an output for receiving a delay output from one of said subsequent delay elements and for providing a final delay output signal which is a time-delayed version of the delay output signal from said one of said subsequent delay elements; and an inverting means for receiving said final delay output signal and for providing an inverted version of said final delay output signal to the input of said first delay element as said first input signal.

6. The apparatus of claim 5 wherein the delay output signal of each of said delay elements has the same logic level as the input signal received by each of said delay elements.

7. The apparatus of claim 6 wherein each of said delay elements comprises:
a first inverting stage for receiving an input signal and for providing an output signal which is an inverted and time-delayed version of said input signal; and
a second inverting stage for receiving the output from said first inverting stage and for providing a delay output signal which is an inverted and time-delayed version of said output signal from said first inverting stage.

8. The apparatus of claim 7 wherein each of said delay elements further receives as inputs a bias signal and a reset signal.

9. The apparatus of claim 8 wherein each of said delay elements further comprises a reset means for receiving said reset signal and, in response, resetting said delay element.

10. The apparatus of claim 8 wherein said reset means comprises a MOS transistor.

11. The apparatus of claim 8 wherein each of said delay elements further comprises a current control means for receiving said bias signal and, in response, controlling the current flow through said first and second inverting stages.

12. The apparatus of claim 11 wherein said current control means comprises two MOS transistors.

13. The apparatus of claim 7 wherein each of said delay elements further comprises a third inverting stage for receiving the delay output signal from said second inverting stage and for providing a digital output signal which is an inverted version of said delay output signal.

14. The apparatus of claim 5 wherein said inverting means is a NAND structure.

15. A method for providing a lower frequency signal with reference to a higher frequency signal, said method comprising the steps of:
generating a first oscillating signal having a first frequency;
generating a second oscillating signal having said first frequency, said second oscillating signal being out of phase with said first oscillating signal by substantially ninety degrees;
logically dividing said first oscillating signal by a selected integer to provide a first divided signal representative of said first oscillating signal having a frequency equal to said first frequency divided by said integer;
logically dividing said second oscillating signal by said integer to provide a second divided signal representative of said second oscillating signal having a frequency equal to said first frequency divided by said integer, said second divided signal being out of phase with said first divided signal by substantially ninety degrees; and
performing an exclusive-OR operation on said first and second divided signals to produce a combined output signal having a frequency equal to said first frequency divided by a selected factor.

16. The method of claim 15, wherein said selected integer is three, and said selected factor is 1.5.

* * * * *